US010355166B2

(12) United States Patent
Jeung et al.

(10) Patent No.: US 10,355,166 B2
(45) Date of Patent: Jul. 16, 2019

(54) LIGHT-EMITTING DIODE STRUCTURE, TRANSFER ASSEMBLY, AND TRANSFER METHOD USING THE SAME

(71) Applicant: KOREA PHOTONICS TECHNOLOGY INSTITUTE, Gwangju (KR)

(72) Inventors: Tak Jeung, Gwangju (KR); Won-Sik Choi, Gwangju (KR); Jun-Beom Park, Gwangju (KR); Jong-Hyeob Baek, Daejeon (KR)

(73) Assignee: KOREA PHOTONICS TECHNOLOGY INSTITUTE (KR)

( * ) Notice: Subject to any disclaimer, the term of this patent is extended or adjusted under 35 U.S.C. 154(b) by 0 days.

(21) Appl. No.: 15/853,778

(22) Filed: Dec. 23, 2017

(65) Prior Publication Data
US 2018/0204973 A1      Jul. 19, 2018

Related U.S. Application Data

(63) Continuation-in-part of application No. PCT/KR2016/014262, filed on Dec. 7, 2016.

(30) Foreign Application Priority Data

Mar. 23, 2016    (KR) .................. 10-2016-0034445

(51) Int. Cl.
*H01L 21/66*    (2006.01)
*G01R 31/26*    (2014.01)
*H01L 33/00*    (2010.01)
*H01L 33/36*    (2010.01)
*H01L 25/075*    (2006.01)
(Continued)

(52) U.S. Cl.
CPC .......... *H01L 33/0079* (2013.01); *H01L 22/20* (2013.01); *H01L 25/0753* (2013.01); *H01L 33/007* (2013.01); *H01L 33/0095* (2013.01); *H01L 33/06* (2013.01); *H01L 33/32* (2013.01); *H01L 33/36* (2013.01); *H01L 33/62* (2013.01); *H01L 33/44* (2013.01);
(Continued)

(58) Field of Classification Search
CPC .. H01L 33/0079; H01L 22/20; H01L 25/0753
USPC ........................................................ 438/15
See application file for complete search history.

(56) References Cited

U.S. PATENT DOCUMENTS 4,775,640 A * 10/1988 Chan .................. G01R 31/2603
                                                      324/754.1
2017/0162552 A1* 6/2017 Thompson ............ H01L 25/167

FOREIGN PATENT DOCUMENTS

JP         4882273 B2    2/2012
JP         5829501 B2   12/2015
(Continued)

OTHER PUBLICATIONS

International Search Report for PCT/KR2016/014262 dated Mar. 27, 2017.

*Primary Examiner* — David S Blum
(74) *Attorney, Agent, or Firm* — Renaissance IP Law Group LLP

(57) ABSTRACT

The present invention is intended to provide a light-emitting diode (LED) structure which can be easily transferred onto another substrate, a transfer assembly whose adhesive strength with LED structures can be maintained in spite of repetitive transfer processes, LED structures and a transfer assembly for selectively transferring the LED structures, and a transfer method using the same.

21 Claims, 15 Drawing Sheets

(51) Int. Cl.
  *H01L 33/06* (2010.01)
  *H01L 33/32* (2010.01)
  *H01L 33/62* (2010.01)
  *H01L 33/44* (2010.01)
(52) U.S. Cl.
  CPC ............... *H01L 2933/0016* (2013.01); *H01L 2933/0025* (2013.01); *H01L 2933/0066* (2013.01)

(56) References Cited

FOREIGN PATENT DOCUMENTS

| | | | |
|---|---|---|---|
| KR | 100610632 B1 * | 8/2006 | ............. H01L 33/00 |
| KR | 100610632 B1 | 8/2006 | |
| KR | 101025696 B1 * | 3/2011 | ......... H01L 21/6838 |
| KR | 101025696 B1 | 3/2011 | |
| KR | 20130075264 A | 7/2013 | |
| KR | 1020130075264 A * | 10/2013 | ............. H01L 33/12 |
| KR | 20140103278 A * | 8/2014 | ....... H01L 21/67144 |
| WO | 2017164484 A1 | 9/2017 | |

* cited by examiner

[FIG. 1]
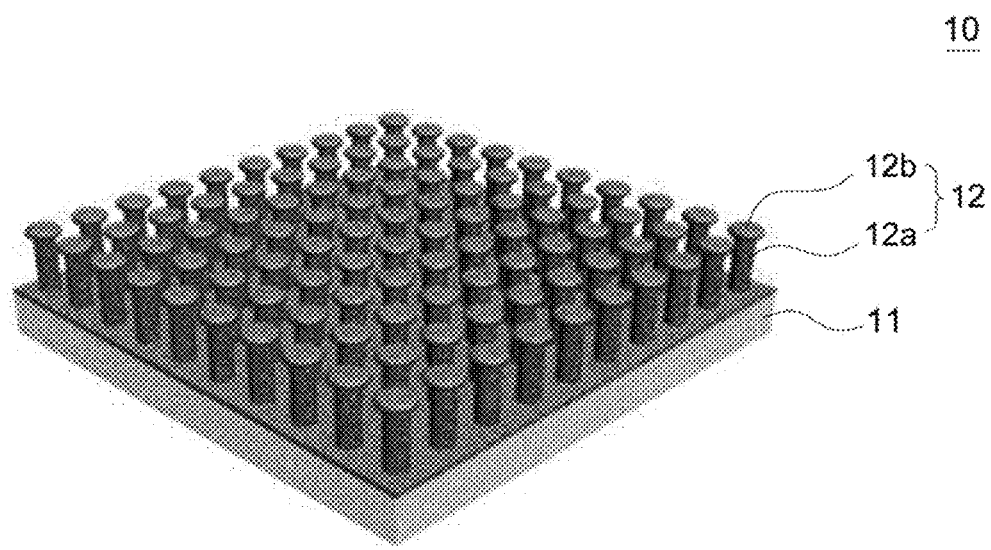
[FIG. 2]
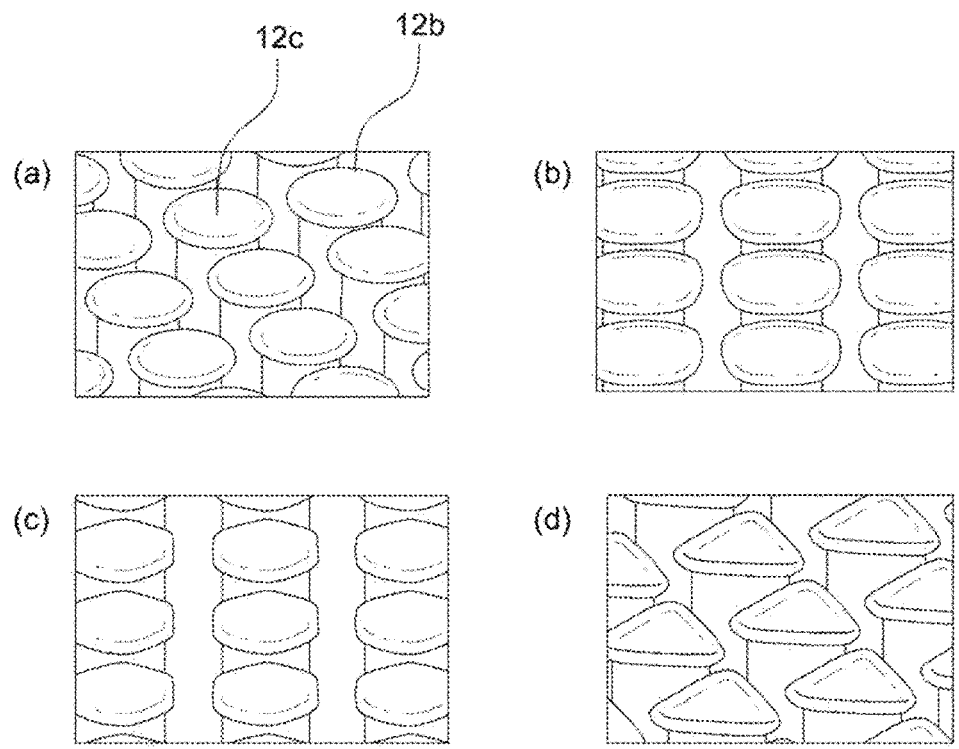

[FIG. 3]
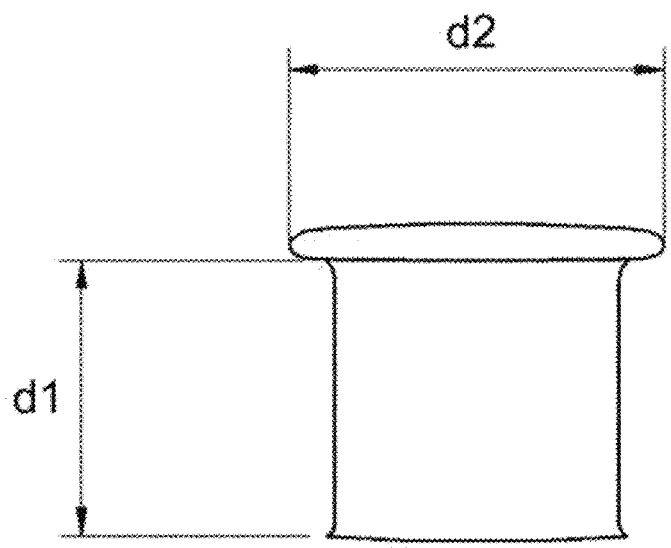
[FIG. 4]
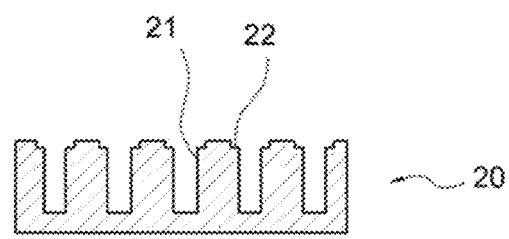
[FIG. 5]
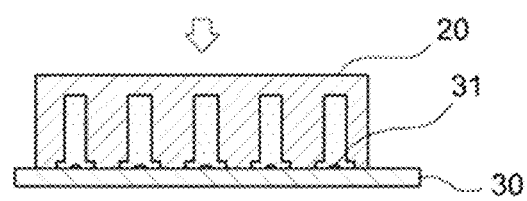

[FIG. 6]
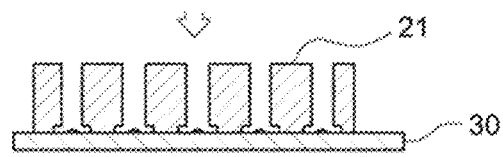
[FIG. 7]
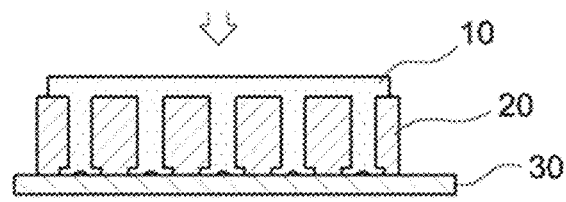
[FIG. 8]
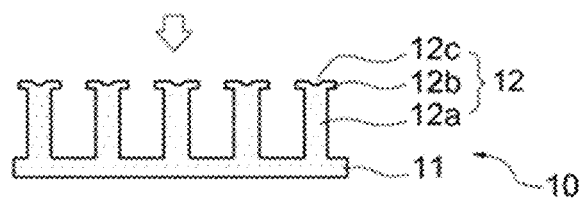
[FIG. 9]
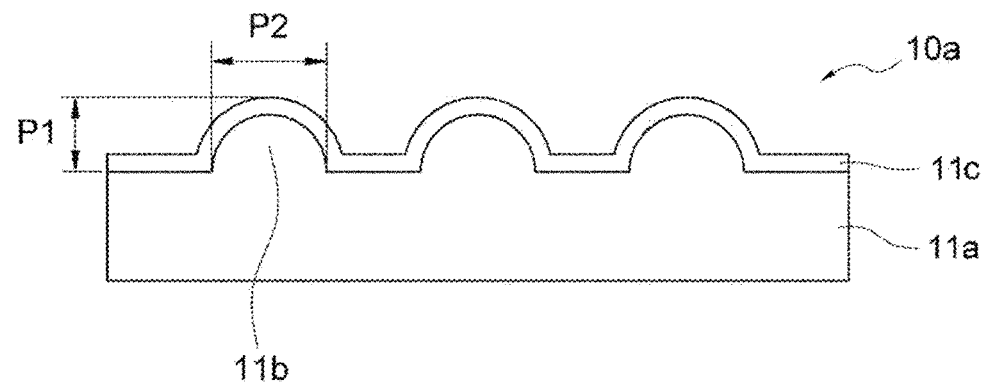

[FIG. 10]
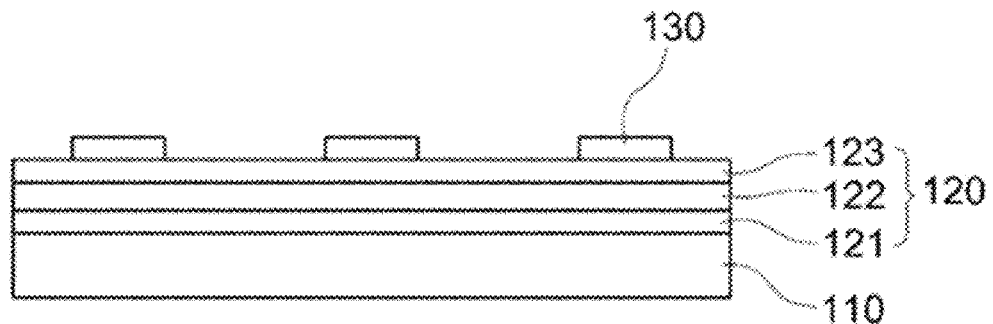
[FIG. 11]
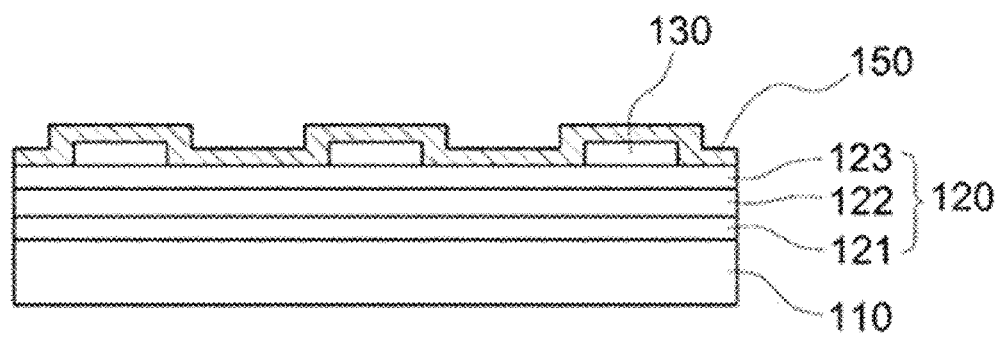
[FIG. 12]
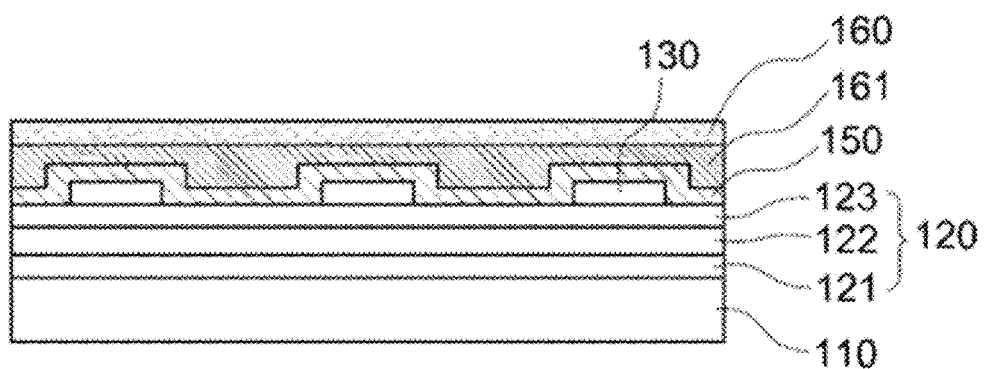

[FIG. 13]
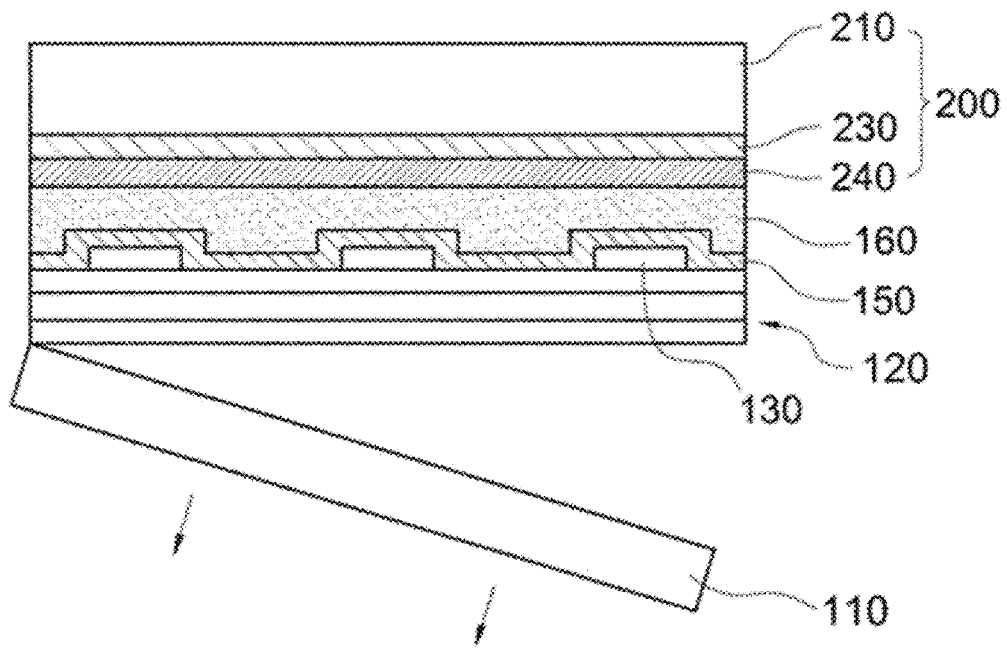
[FIG. 14]
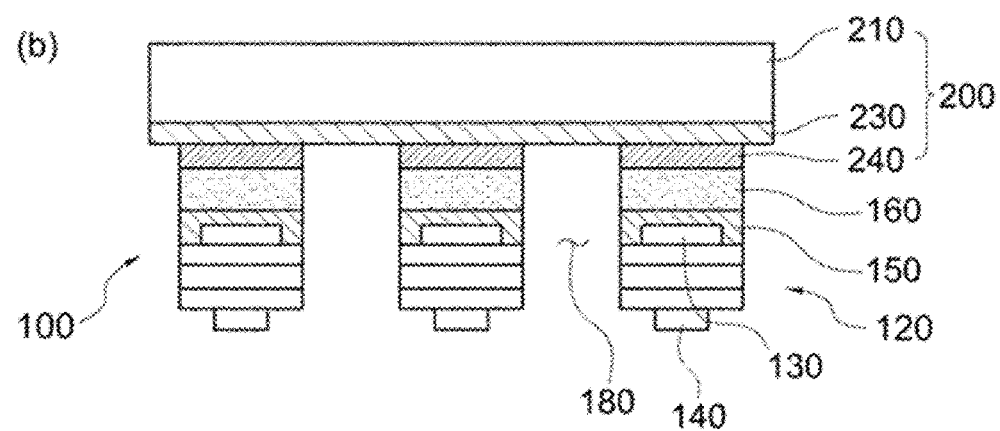

[FIG. 15]
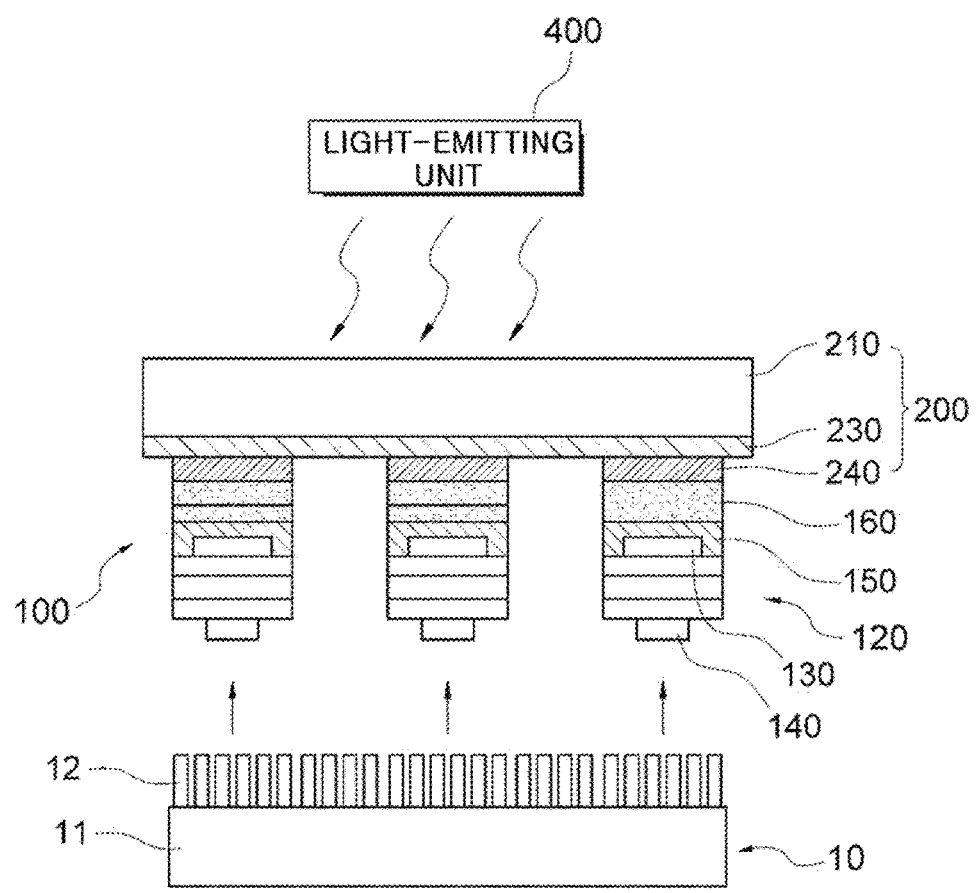

[FIG. 16]
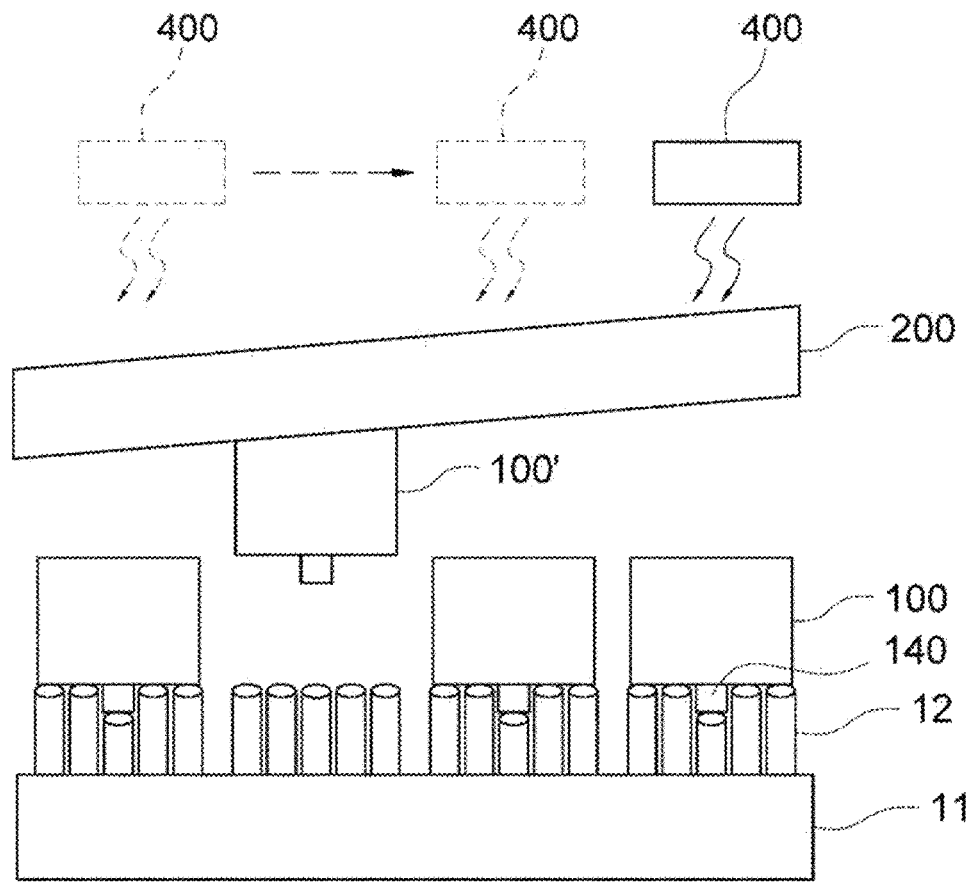
[FIG. 17]
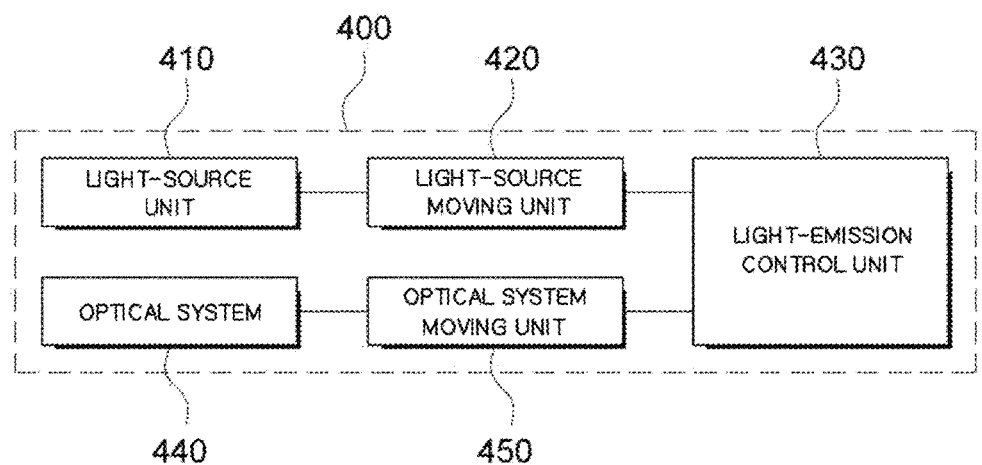

[FIG. 18]
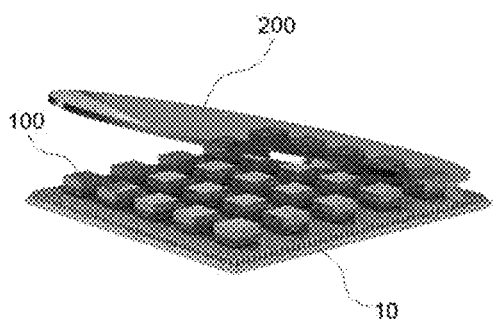
[FIG. 19]
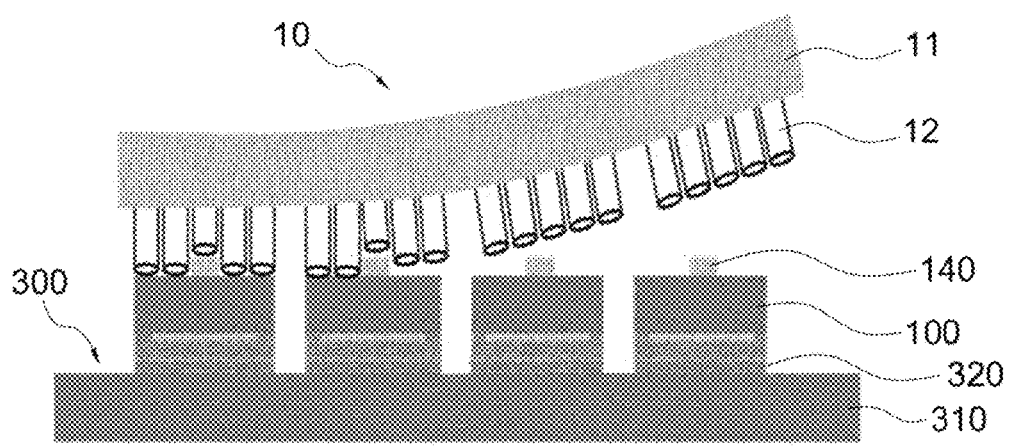
[FIG. 20]
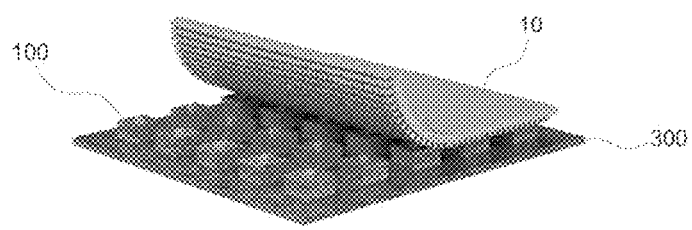

[FIG. 21]
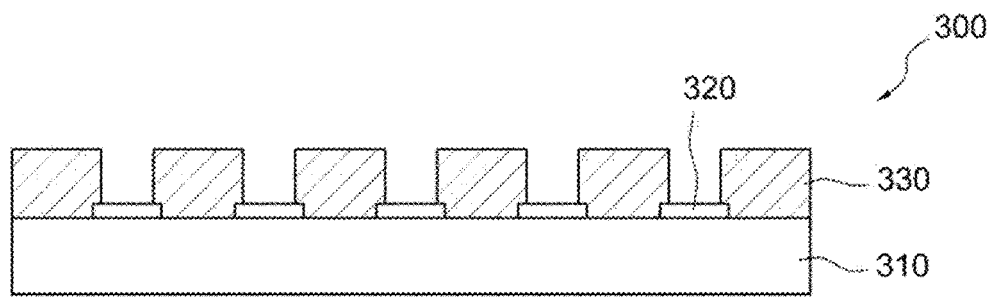
[FIG. 22]
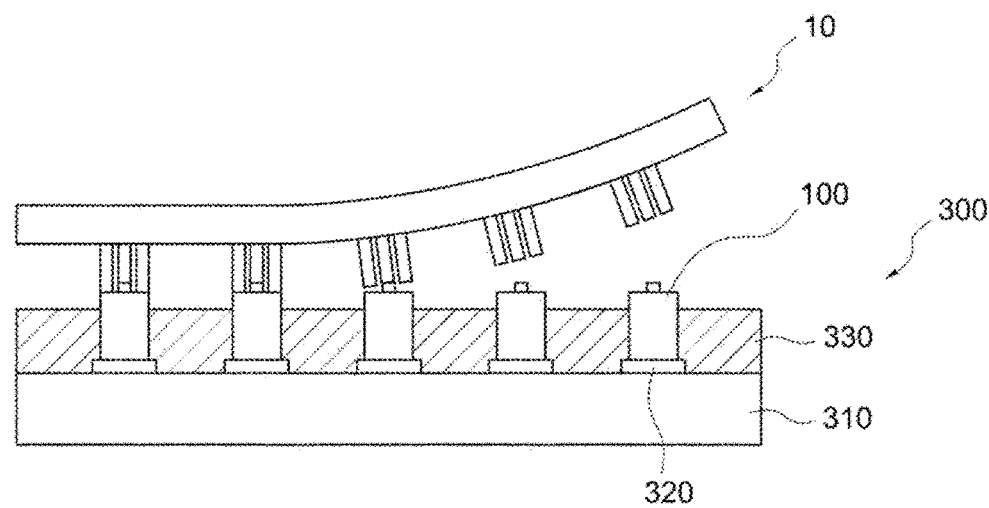
[FIG. 23]
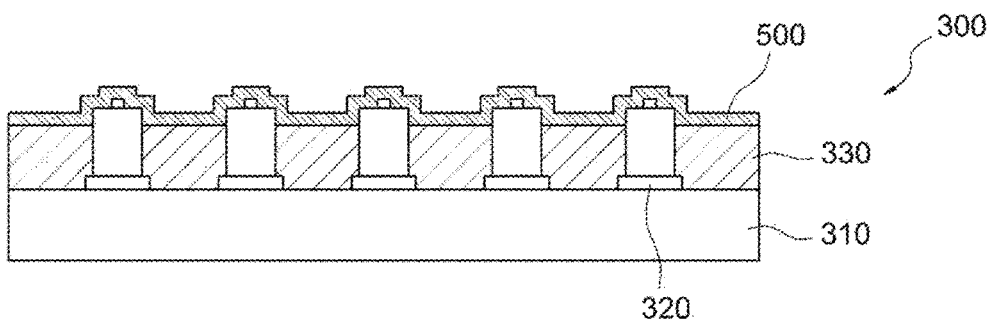

[FIG. 24]
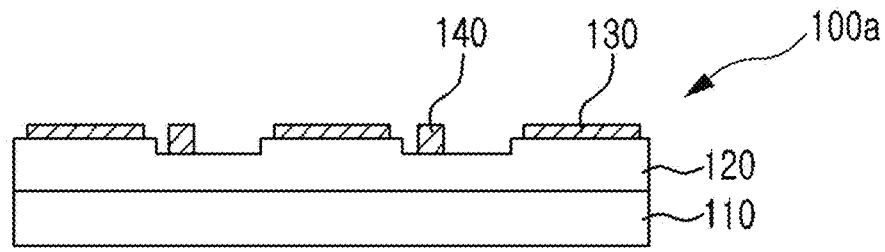
[FIG. 25]
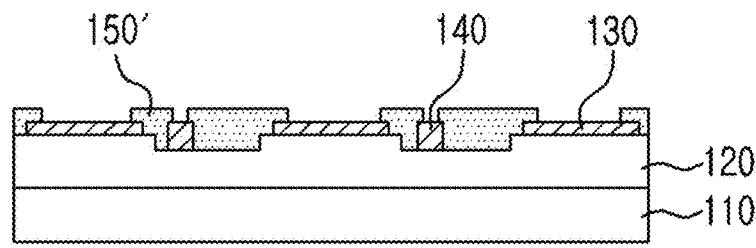
[FIG. 26]
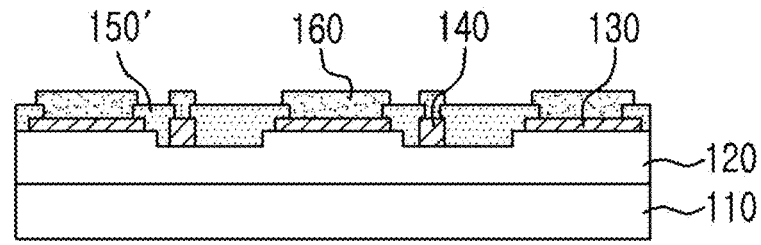
[FIG. 27]
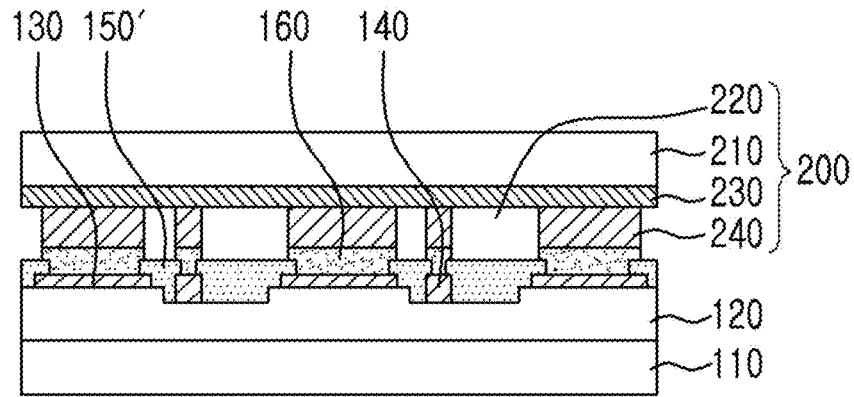

[FIG. 28]
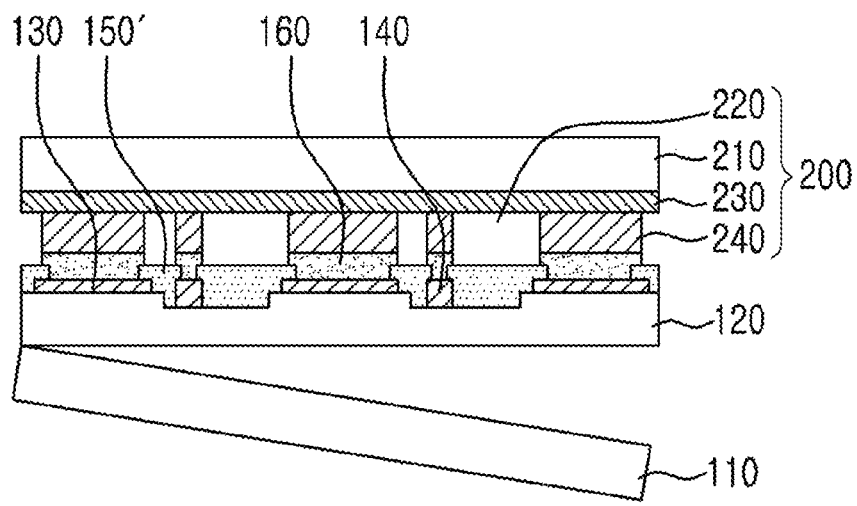
[FIG. 29]
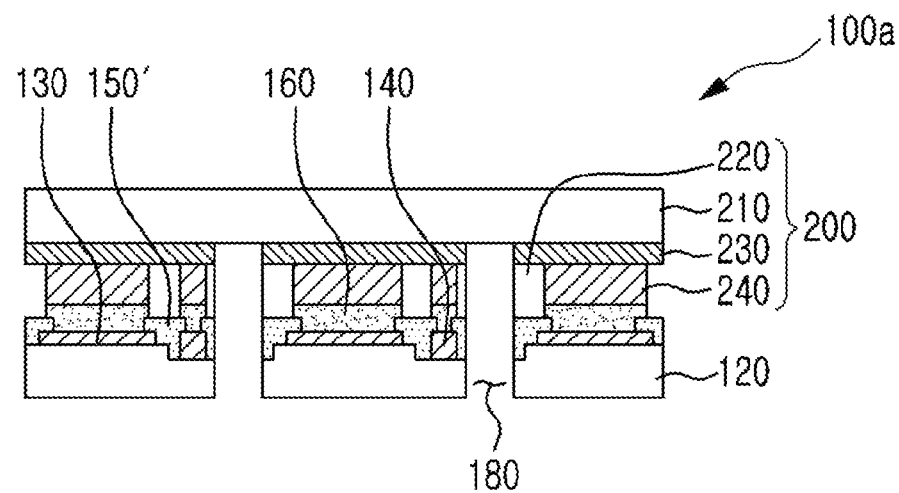

[FIG. 30]
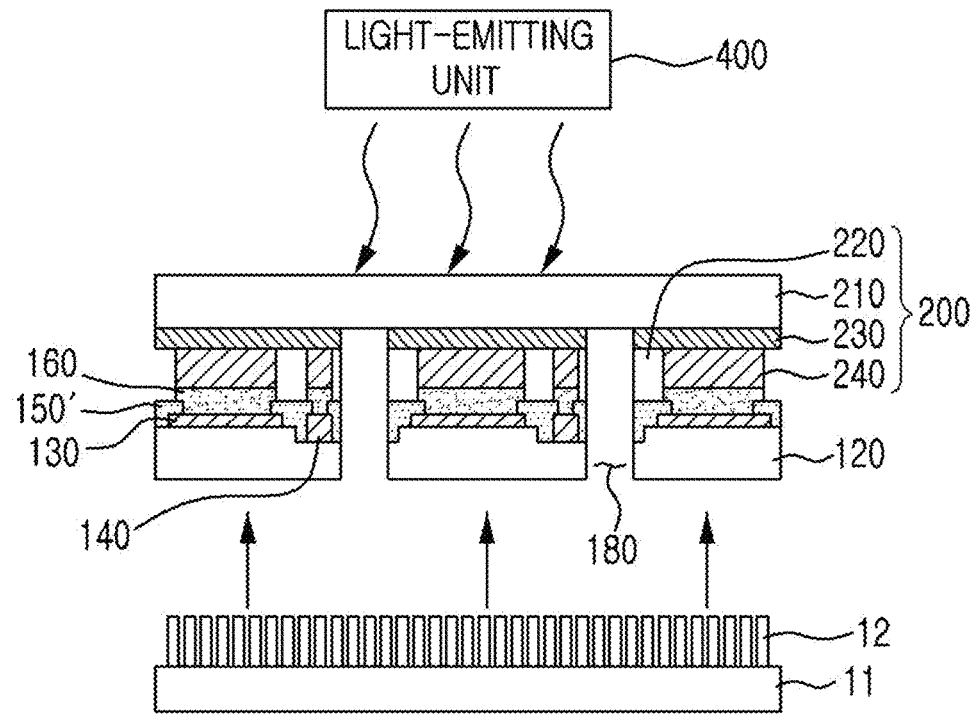
[FIG. 31]
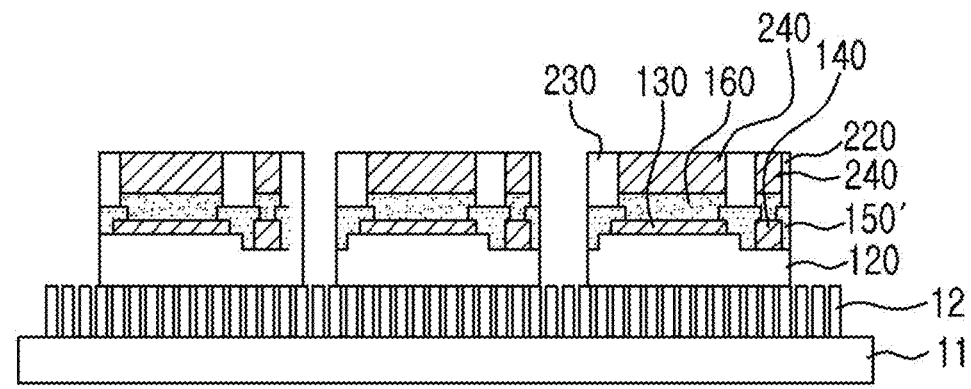

[FIG. 32]
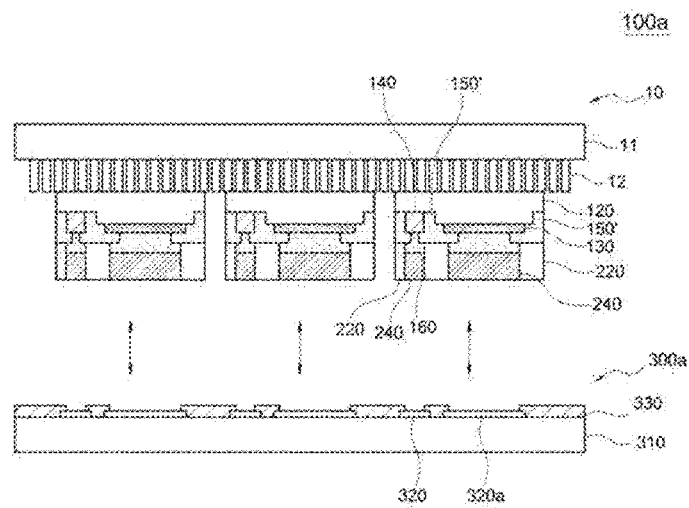
[FIG. 33]
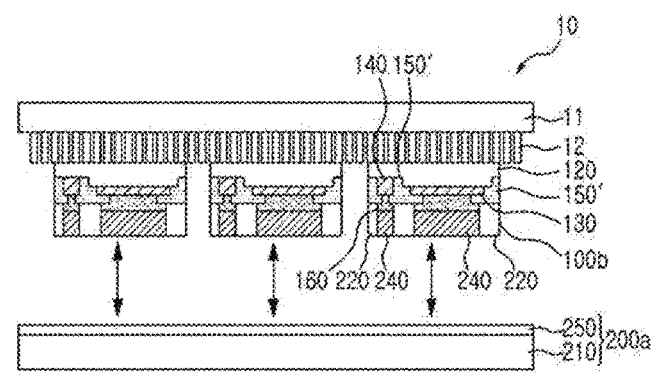
[FIG. 34]
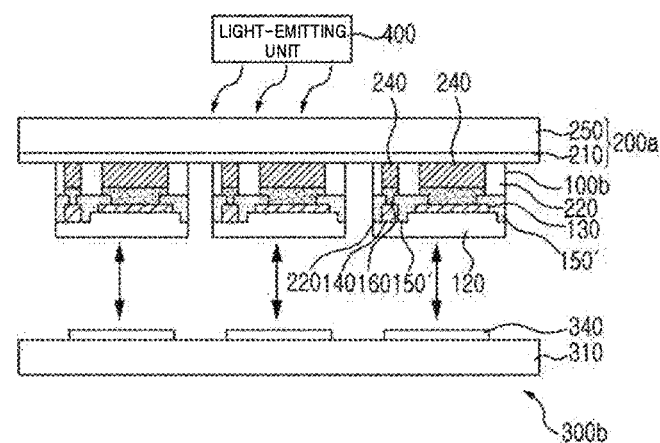

[FIG. 35]
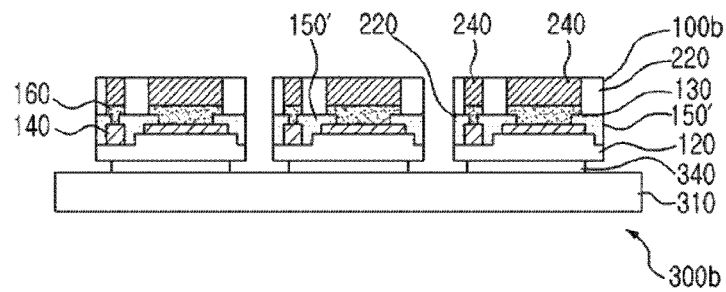
[FIG. 36]
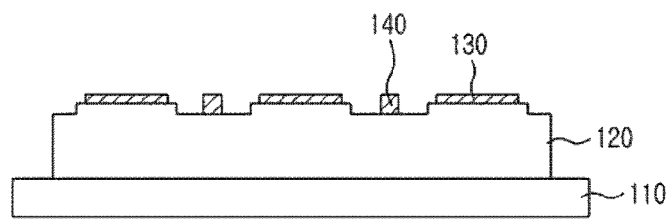
[FIG. 37]
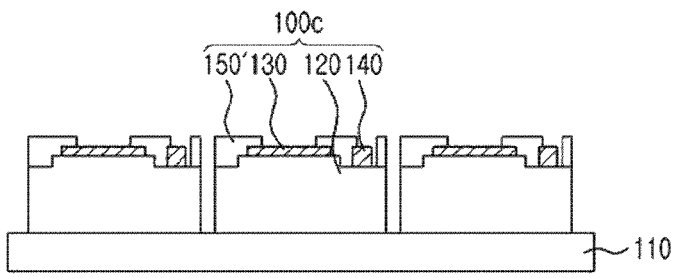
[FIG. 38]
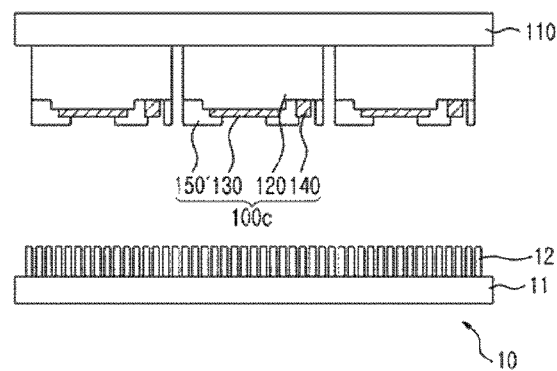

[FIG. 39]
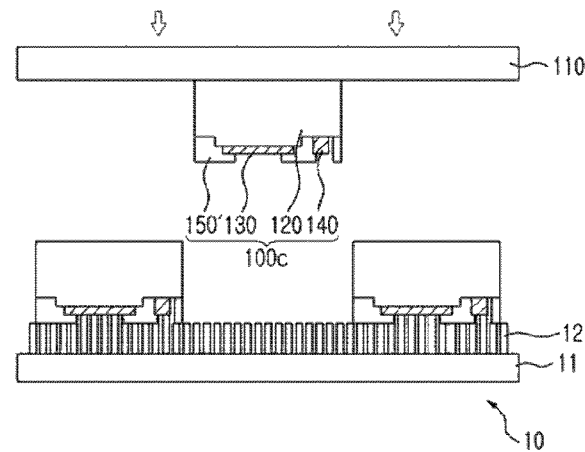
[FIG. 40]
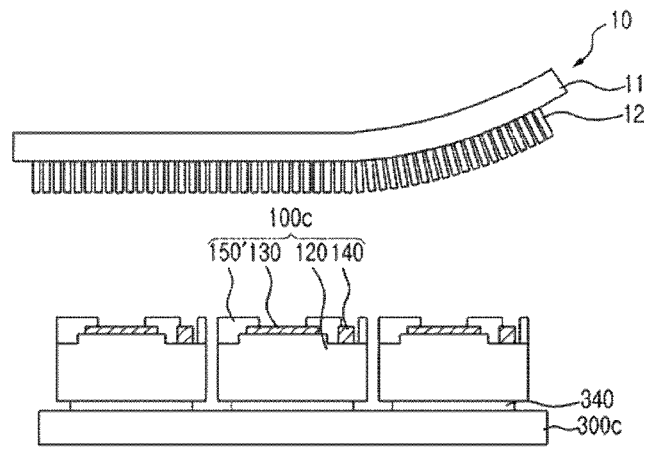

LIGHT-EMITTING DIODE STRUCTURE, TRANSFER ASSEMBLY, AND TRANSFER METHOD USING THE SAME

CROSS-REFERENCE TO RELATED APPLICATION

This application is Continuation In Part (CIP) of PCT/KR2016/014262, filed Dec. 7, 2016, which claims priority to Korean Patent Application No. 10-2016-0034445 filed on Mar. 22, 2016 and all the benefits accruing therefrom under 35 U.S.C. § 119, the contents of which are incorporated by reference in their entirety.

TECHNICAL FIELD

The present invention relates to a light-emitting diode (LED) structure, a transfer assembly, and a transfer method using the same, and more particularly, to an LED structure which can be easily transferred onto another substrate, a transfer assembly whose adhesive strength with LED structures can be maintained in spite of repetitive transfer processes, LED structures and a transfer assembly for selectively transferring the LED structures, and a transfer method using the same.

BACKGROUND ART

Recently, the demand for lighting fixtures and the like composed of a light-emitting diode (LED) is explosively increasing due to advantages thereof, such as a longer lifespan than a conventional incandescent lamp or fluorescent lamp, relatively low power consumption, no pollutants released during a manufacturing process thereof, and the like. An LED is used not only in a display device involving light emission but also as a backlight device of a lighting fixture or a liquid crystal display (LCD) device, that is, application fields thereof are being diversified.

Particularly, since an LED can be operated at relatively low voltage and has high energy efficiency, little heat is emitted therefrom and the lifespan thereof is long. Also, with the development of technology for providing white light with high brightness, which is difficult to conventionally implement, LEDs are expected to replace most currently used light sources.

A general nitride semiconductor light-emitting device has a structure including a buffer layer, an n-type nitride semiconductor layer, an active layer, which has a multi-quantum well structure, and a p-type nitride semiconductor layer sequentially formed on a substrate, and the p-type nitride semiconductor layer and the active layer have a structure in which an upper surface of the n-type nitride semiconductor layer is partially exposed by removing partial regions of the p-type nitride semiconductor layer and the active layer through a process such as etching.

After an n-type electrode is formed on the exposed n-type nitride semiconductor layer and a transparent electrode layer is formed on the p-type nitride semiconductor layer to form an ohmic contact, a p-type bonding electrode is formed.

Meanwhile, a new attempt is being made to apply a recent LED light source to various industries over the existing range of lighting fixtures. In particular, a variety of application results are being reported from a low-power flexible display device, a wearable and attachable information display device, the field of photonic textiles in which a conductive fiber and an LED light source are combined, a body-attachable and implantable medical device, a biofusion field for verifying optogenetic validity, head mounted display (HMD) and wireless communication fields, and the like.

Generally, when an LED chip is manufactured to be small, it is possible to overcome a problem of an inorganic material being broken when bent due to features thereof. Also, by transferring the LED chip onto a flexible substrate, it is possible to impart flexibility to the LED chip and widely use the LED chip in the aforementioned various fields.

Meanwhile, it is necessary to develop a subminiature thin flexible LED light source based on a flexible device or material so that LED light sources are applied to the aforementioned various fields.

To implement such a subminiature flexible LED light source, it is necessary for a process of separating a thin film of GaN LEDs, which are formed at a size of 1 to 100 μm on a sapphire substrate, from a mother substrate through laser lift off (LLO) and transferring GaN LED structures of the separated thin film onto a flexible substrate separately or in a desired arbitrary arrangement.

Korean Unexamined Patent Publication No. 10-2014-0103278 (title: Method of Fabricating Micro-device Transfer Head) discloses a technology for placing a transfer head on a carrier substrate on which an array of micro LED structures are disposed, performing an operation of causing a phase change of an adhesive layer for at least one of the micro LED structures, picking up a micro P-N diode, a metallization layer, and optionally a part of a conformal dielectric barrier layer for at least one of the micro LED structures by using an electrostatic transfer head, and disposing the micro P-N diode, the metallization layer, and optionally the part of the conformal dielectric barrier layer for at least one of the micro LED structures on a receiving substrate.

Here, a method of attaching LEDs to a separate support substrate, inducing a phase change of an interface from solid to liquid by heating the interface, and then transferring the LEDs to individual chips by weakening adhesive strength of the interface is used to transfer each individual micro LED structure or an array of micro LED structures.

However, such a conventional technology causes a uniformity problem in a process of changing a bonding interface of at least one micro LED structure from a solid state to a liquid state, and thus some LED structures are not transferred to a pickup head.

Also, since LEDs are not separated from the support substrate, it is difficult to transfer the LEDs separately or in units of arrays. Further, an electrostatic manner of the transfer head causes serious physical damage to micro LED structures, which are very thin, which leads to a reduction in reliability.

DISCLOSURE

Technical Problem

The present invention is directed to providing a light-emitting diode (LED) structure which can be easily transferred onto another substrate, a transfer assembly whose adhesive strength with LED structures can be maintained in spite of repetitive transfer processes, LED structures and a transfer assembly for selectively transferring the LED structures, and a transfer method using the same.

Technical Solution

One aspect of the present invention bonds a plurality of p-n junction LED structures to a temporary substrate through metal bonding layers, and separates the bonded LED structures to be separated from the temporary substrate separately or in an array form when adhesive strength with the temporary substrate is weakened due to light of a predetermined wavelength range.

Also, the LED structures according to the present invention may be bonded to the temporary substrate through the metal bonding layers by eutectic bonding.

Also, the LED structures according to the present invention may have any one of a horizontal structure, a vertical structure, and a flip chip structure.

Also, the LED structures according to the present invention may include epitaxial structures from which a growth substrate is removed, first electrodes, second electrodes, and the metal bonding layers.

Also, the metal bonding layers according to the present invention may include at least one of Au, AuSn, PdIn, InSn, NiSn, Au—Au, AgIn, and AgSn.

Also, the temporary substrate according to the present invention may include: a temporary substrate body; an ultraviolet (UV) absorption layer formed on the temporary substrate body; and a metal bonding layer formed on the UV absorption layer, wherein, when UV rays of the predetermined wavelength range are absorbed by the UV absorption layer, the adhesive strength with the metal bonding layer is weakened.

Also, the temporary substrate body according to the present invention may be a transparent substrate made of at least one of a flexible material and a rigid material for preventing bowing.

Also, the temporary substrate body according to the present invention may be made of any one of glass, sapphire, plastic, polymethylmethacrylate (PMMA), polyurethaneacrylate (PUA), polyethylene terephthalate (PET), polyimide (PI), polydimethylsiloxane (PDMS), polyolefin (PO), polyvinyl chloride (PVC), polycarbonate (PC), polyethylene (PE), polypropylene (PP), and polystyrene (PS).

Also, the UV absorption layer according to the present invention may absorb UV rays of a range of 190 nm to 280 nm.

Another aspect of the present invention causes adhesive members, which are arranged in an arbitrary pattern on a body unit, to have adhesive strength, van der Waals attractive force, or capillary attractive force by coming into contact with LED structures, which are transfer targets, to maintain adhesive strength with the LED structures.

Also, a transfer assembly according to the present invention may include a body unit; and a plurality of ciliary units configured to extend by a predetermined length from an upper surface of the body unit, form a predetermined pattern so that the plurality of ciliary units can be selectively bonded to the LED structures, and provide the adhesive strength by having molecular attractive force with surfaces of the LED structures.

Also, the ciliary units according to the present invention include: ciliary unit bodies formed to extend by the predetermined length from the upper surface of the body unit; and adsorption units configured to be installed at ends of the ciliary unit bodies to come into contact with the surfaces of the LED structures and provide the adhesive strength by having van der Waals attractive force or capillary attractive force caused by adsorption to the contacted surfaces of the LED structures.

Also, the ciliary units according to the present invention may additionally include, at ends of the adsorption units, adsorption unit recesses for increasing contact areas between the adsorption units and the surfaces of the LED structures and improving adhesive strength between the adsorption units and the LED structures.

Also, cross sections of the adsorption units according to the present invention may have any one shape among a circle, an ellipse, and a polygon having three or more sides.

Also, the ciliary unit body according to the present invention may have a height (d1) of 1 μm to 200 μm.

Also, the adsorption units according to the present invention may have a diameter (d2) of 1 μm to 300 μm.

Also, the adsorption units according to the present invention may have a pitch of 0.5 μm to 300 μm between neighboring adsorption units.

Also, the transfer assembly according to the present invention may be made of any one material among PDMS, PUA, polyethyleneglycol (PEG), PMMA, PS, an epoxy resin, a urethane resin, an acrylic resin, and fluorine rubber.

Also, the transfer assembly according to the present invention may include: a body unit; and an adhesive unit configured to be applied to the body unit, come into contact with the surfaces of the LED structures, and provide adhesive strength.

Also, the transfer assembly according to the present invention may further include a plurality of protrusion units configured to protrude from an upper surface of the body unit by a predetermined length and form an arbitrary pattern.

Also, the protrusion units according to the present invention may have a height (P1) of 0 μm to 50 μm and a pitch (P2) of 1 μm to 300 μm.

Another aspect of the present invention includes: a) forming an epitaxial structure on a growth substrate and fabricating an LED structure by forming at least one of first electrodes and second electrodes on the epitaxial structure; b) forming a metal bonding layer on the fabricated LED structure and bonding, onto the metal bonding layer of the LED structure, a temporary substrate configured to have adhesive strength which is weakened when light of a predetermined wavelength range is absorbed; c) forming individual LED structures by removing the growth substrate from the epitaxial structure and etching the epitaxial structure, and detecting a faulty LED structure by checking whether the formed individual LED structures operate normally; d) bonding a transfer assembly to the LED structures due to adhesive strength, van der Waals attractive force, or capillary attractive force by bringing the transfer assembly into contact with the LED structures; e) selectively emitting light of a predetermined wavelength range toward a region of the temporary substrate in which the faulty LED structure is detected or a region of the temporary substrate in which a normally operating LED structure is installed through a light-emitting unit; and f) causing any one of the LED structure or the faulty LED structure to be selectively separated and moved to the transfer assembly when the adhesive strength of the temporary substrate is weakened.

Also, the LED structures and the temporary substrate according to the present invention may be bonded together through the metal bonding layer by eutectic bonding.

Also, the method of transferring an LED structure according to the present invention may further include g) transferring the LED structure moved to the transfer assembly in step f) to a target substrate obtained by forming arbitrary target substrate bonding units on a target substrate body.

Also, the target substrate according to the present invention may further include a post unit configured to be installed around each of the target-substrate bonding units to fix the LED structure on the target substrate body and electrically insulate the LED structure.

Also, the target-substrate bonding unit according to the present invention may include at least one of a soldering material, Sn, In, Ni, Au, Pd, Cu, Ag, Ge, Al, AuSn, InAg, PdIn, AgIn, and a paste containing Cu and Ag or Ag.

Also, the post unit according to the present invention may include at least one of epoxy, acryl, PMMA, benzocyclobutene (BCB), PI, PU, polyester (PE), and a photoresist (PR).

Also, the light-emitting unit according to the present invention may change an irradiation position and an irradiation range by adjusting intensity and a size of the emitted light.

Another aspect of the present invention includes: i) bringing a transfer assembly of a ciliary structure, which provides adhesive strength through van der Waals attractive force or capillary attractive force, into contact with LED structures or an LED structure array bonded to a temporary substrate on which a metal bonding layer is formed and which have a light absorption layer so that adhesive strength thereof is weakened when light of a predetermined wavelength range is absorbed and bonding the transfer assembly and the LED structures or the LED structure array; ii) selectively emitting light of the predetermined wavelength range toward an arbitrary region of the temporary substrate through a light-emitting unit; and iii) selectively separating LED structures or an LED structure array in a region of the temporary substrate whose adhesive strength is weakened by the light-emitting unit and moving the separated LED structures or LED structure array to the transfer assembly.

Also, the LED structures according to the present invention may have any one of a horizontal structure, a vertical structure, and a flip chip structure.

Advantageous Effects

The present invention has an advantage in that it is possible to provide light-emitting diode (LED) structures which can be easily transferred onto another substrate.

Also, the present invention has an advantage in that it is possible to provide a transfer assembly whose adhesive strength with LED structures can be maintained in spite of repetitive transfer processes for LED structures or an LED structure array.

Further, the present invention has an advantage in that it is possible to selectively provide only quality LED structures through a screening process of selectively removing a faulty LED structure.

DESCRIPTION OF DRAWINGS

FIG. 1 is a perspective view of a transfer assembly for transferring light-emitting diode (LED) structures according to the present invention.

FIG. 2 shows exemplary views of shapes of adsorption units of a transfer assembly for transferring LED structures according to the present invention.

FIG. 3 is an exemplary view of a ciliary unit of a transfer assembly for transferring LED structures according to the present invention.

FIGS. 4 to 8 are cross-sectional views showing a fabrication process of a transfer assembly for transferring LED structures according to the present invention.

FIG. 9 is a cross-sectional view of another transfer assembly according to the present invention.

FIGS. 10 to 23 are cross-sectional views, perspective views, and a block diagram illustrating a process of transferring LED structures according to a first embodiment of the present invention.

FIGS. 24 to 32 are cross-sectional views showing a process of transferring LED structures according to a second embodiment of the present invention.

FIGS. 33 to 35 are cross-sectional views showing a process of transferring LED structures according to a second embodiment of the present invention FIGS. 36 to 40 are cross-sectional views showing a process of transferring LED structures according to a third embodiment of the present invention.

MODES OF THE INVENTION

Hereinafter, a light-emitting diode (LED) structure, a transfer assembly, and a transfer method using the same according to embodiments of the present invention will be described in detail with reference to the accompanying drawings.

Fabrication Example 1 of Transfer Assembly

FIG. 1 is a perspective view of a transfer assembly for transferring LED structures according to the present invention, FIG. 2 shows exemplary views of shapes of adsorption units of a transfer assembly for transferring LED structures according to the present invention, FIG. 3 is an exemplary view of a ciliary unit of a transfer assembly for transferring LED structures according to the present invention, and FIGS. 4 to 8 are cross-sectional views showing a fabrication process of a transfer assembly for transferring LED structures according to the present invention.

As shown in FIGS. 1 to 3, a transfer assembly 10 according to the present invention includes a body unit 11 and ciliary units 12 so that adhesive members, that is, the ciliary units 12, arranged in an arbitrary pattern on the body unit 11 may have van der Waals attractive force or capillary attractive force by coming into contact with LED structures, which are transfer targets, and maintain adhesive strength with the LED structures.

Each of the LED structures includes a p-n junction epitaxial structure from which a growth substrate has been removed, at least one of a first electrode and a second electrode formed on the epitaxial structure, and a metal bonding layer for bonding to a temporary substrate.

The transfer assembly 10 may be made of a polymer resin, that is, one of polydimethylsiloxane (PDMS), polyurethaneacrylate (PUA), polyethyleneglycol (PEG), polymethylmethacrylate (PMMA), polystyrene (PS), an epoxy resin, a urethane resin, an acrylic resin, and fluorine rubber. However, the transfer assembly 10 is not limited thereto and may be implemented by using various resins.

The body unit 11 is a member which can be configured to have various shapes, and may be configured to have various shapes according to an array of LED structures or a pattern for transferring the LED structures. Although the body unit 11 is described as being a rectangular member for convenience of description in the present embodiment, the shape of the body unit 11 is not limited thereto.

The ciliary units 12 are formed to extend from an upper surface of the body unit 11 by a predetermined length, and may be formed in various patterns, such as a matrix pattern, a pattern in which the ciliary units 12 are spaced apart, and the like to be selectively bonded to LED structures. The ciliary units 12 provide adhesive strength by having molecular attractive force (van der Waals force) or capillary attractive force with surfaces of the LED structures, and include ciliary unit bodies 12a, adsorption units 12b, and adsorption unit recesses 12c.

The ciliary unit bodies 12a may be formed to extend from the upper surface of the body unit 11 by the predetermined length in a vertical direction or may be tilted by a predetermined angle from the upper surface of the body unit 11. Preferably, the ciliary unit bodies 12a are formed to extend in the vertical direction.

Also, the ciliary unit bodies 12a may be pillars whose cross-sections have various shapes, such as a circle, an ellipse, a polygon having three or more sides, and the like. A height d1 of the ciliary unit bodies 12a is in the range of 1 μm to 200 μm so that adhesive strength may be adjusted by adjusting the height according to a size of LED structures, which are transfer targets, or to adhesive strength with the LED structures.

When the height of the ciliary unit bodies 12a is less than 1 μm, it is difficult to have the adhesive strength due to roughness of surfaces of the LED structures, and when the height is more than 200 μm, the ciliary unit bodies 12a may fall down, and the adhesive strength may be reduced.

The adsorption units 12b are installed at ends of the ciliary unit bodies 12a to come into contact with the surfaces of the LED structures and provide the adhesive strength by having attractive force with the contacted surface of the LED structure.

Also, cross-sections of the adsorption units 12b have any one shape among a circle, an ellipse, and a polygon having three or more sides, and the adsorption units 12b have a diameter d2 of 1 μm to 300 μm. A pitch between the adsorption units 12b is in the range of 0.5 μm to 300 μm so that the adhesive strength may be adjusted by adjusting the diameter according to the size of the LED structures, which are transfer targets, or the adhesive strength with the LED structures.

The adsorption unit recesses 12c may be formed on upper surfaces of the adsorption units 12b to improve the adhesive strength by increasing contact areas between the adsorption units 12b and the surfaces of the LED structures.

The adsorption unit recesses 12c are formed as concave portions in upper surface areas of the adsorption units 12b to provide large contact areas between the adsorption units 12b and the LED structures.

Also, the adsorption unit recesses 12c produce vacuum pressure through the concave portions due to a difference in pressure between the adsorption units 12b and the LED structures such that adhesive strength between the adsorption units 12b and the LED structures may be further increased.

In other words, in a process in which the adsorption units 12b are bonded to the surfaces of the LED structure, a pressure of a predetermined magnitude is applied to the adsorption units 12b, and air is discharged from the adsorption unit recesses 12c such that a contact state of the adsorption units 12b and the LED structures is maintained at a lower pressure than ambient pressure.

Subsequently, when the pressure applied to the adsorption units 12b is removed, air is discharged from the adsorption unit recesses 12c, and the contact state of the adsorption units 12b and the LED structures 100 is maintained at a lower pressure than ambient pressure such that a higher adhesive strength is produced due to van der Waals force or capillary attractive force.

Next, a fabrication process of a transfer assembly according to the present invention will be described.

Referring to FIG. 4, ciliary-unit forming patterns 21 are formed on a silicon wafer at predetermined intervals to come into contact with LED structures, which are transfer targets, and a pattern forming unit 20 is fabricated at ends of the ciliary-unit forming patterns 21 so that adsorption-unit forming recesses 22 are formed.

In the pattern forming unit 20, the ciliary-unit forming patterns 21 and patterns of the adsorption-unit forming recesses 22 are formed on the silicon wafer through etching by using a photoresist as a mask.

Referring to FIG. 5, when the pattern forming unit 20 is fabricated, a glass unit 30 is bonded and fixed to the pattern forming unit 20 in which the ciliary-unit forming patterns 21 are formed.

Here, protrusion units 31 may be formed at predetermined intervals on a surface of the glass unit 30. The protrusion units are installed in the adsorption-unit forming recesses 22 of the pattern forming unit 20 such that the adsorption unit recess 12c (see FIG. 2) may be formed in the ciliary units 12 of the transfer assembly 10.

Smooth surfaces are formed on the ciliary units 12 of the transfer assembly 10 through the glass unit 30 such that adhesive strength of the transfer assembly may be further improved.

Referring to FIG. 6, when the pattern forming unit 20 is fixed to the glass unit 30, a backside of the fixed pattern forming unit 20 is etched to form the ciliary-unit forming patterns 21 on the glass unit 30.

Referring to FIG. 7, when the ciliary-unit forming patterns 21 are formed on the glass unit 30, a polymer material is injected into the ciliary-unit forming patterns 21 on the glass unit 30 and hardened.

Referring to FIG. 8, when the hardening is completed, the ciliary-unit forming patterns 21 and the glass unit 30 are removed to generate the transfer assembly 10 having the body unit 11 and the ciliary units 12.

A method of fabricating a transfer assembly of an LED structure array by using a dry adhesive structure is not limited to the above-described method, and various methods may be used.

Therefore, with the transfer assembly of an LED structure array having a dry adhesive structure, it is possible to provide a transfer assembly whose adhesive strength with LED structures can be maintained in spite of repetitive transfer processes for the individual LED structures or an LED structure array.

Fabrication Example 2 of Transfer Assembly

FIG. 9 is a cross-sectional view of another transfer assembly according to the present invention.

Referring to FIG. 9, a transfer assembly 10a includes a body unit 11a in the form of a flat board and an adhesive unit 11c which is applied to the body unit 11a and comes in contact with a surface of the LED structures 100 to provide adhesive strength. Preferably, the transfer assembly 10a is made of a polymer resin.

Also, a plurality of protrusion units 11b protrude from an upper surface of the body unit 11a by a predetermined length to form an arbitrary pattern such that the transfer assembly 10a may easily come into contact with the LED structures 100.

The protrusion units 11b have a height P1 of 0 μm to 50 μm and a pitch P2 of 1 μm to 300 μm, and the height P1 of 0 μm denotes that the protrusion units 11b are not installed.

In other words, the adhesive strength of the transfer assembly 10a according to FIG. 9 is only required to keep the LED structures 100, which are transferred onto the transfer assembly 10a due to the adhesive strength of a temporary substrate 200 weakening, attached to the transfer assembly 10a.

First Embodiment

FIGS. 10 to 23 are cross-sectional views, perspective views, and a block diagram illustrating a process of transferring LED structures according to the first embodiment of the present invention.

Referring to FIG. 10, an epitaxial structure 120 is formed on a growth substrate 110, and second electrodes 130 are formed on the epitaxial structure 120.

A sapphire substrate, a silicon substrate, or the like may be used as the growth substrate 110, and substrates made of various materials may be used as long as they have an epitaxial structure for crystal growth.

The epitaxial structure 120 is formed on the growth substrate 110 and has a first semiconductor layer 121, an active layer 122, and a second semiconductor layer 123. A buffer layer may be formed between the growth substrate 110 and the first semiconductor layer 121.

The first semiconductor layer 121 may be an n-type nitride semiconductor layer, the second semiconductor layer 123 may be a p-type nitride semiconductor layer, and the first and second semiconductor layers 121 and 123 may have opposite conductivities. Also, the active layer 122 preferably has a multi-quantum well structure.

The second electrode 130 may be made of one or more materials selected from the group consisting of indium tin oxide (ITO), $InO_2$, $SnO_2$, Ni, Au, Pd, Ag, Pt, Ti, Al, and Cr, or an alloy or multiple layers thereof.

Referring to FIG. 11, a diffusion barrier layer 150 is formed on an upper surface of the second semiconductor layer 123 of the epitaxial structure 120 and the second electrodes 130. The diffusion barrier layer 150 protects some metal elements of a metal bonding layer, which will be formed later, and prevents diffusion of metal components. To this end, the diffusion barrier layer 150 may include Ni, Ti, Pt, Pd, Cu, CuW, Mo, MoW, Ag, Au, Sn, W, In, or ITO.

Also, the diffusion barrier layer 150 may be conformally formed over an upper surface of the structure of FIG. 10. The conformally formed diffusion barrier layer 150 may fill a space between the second electrodes 130, have a structure whose upper surface is flattened, and have a concave and convex shape along the upper surface of the structure shown in FIG. 10.

Referring to FIG. 12, a metal bonding layer 160 is formed on the diffusion barrier layer 150. The metal bonding layer 160 includes at least one of Au, AuSn, PdIn, InSn, NiSn, Au—Au, Sn, In, Pd, Ni, Ag, AgIn, and AgSn. Also, a planarization layer 161 may be further formed between the metal bonding layer 160 and the diffusion barrier layer 150. The formation of the planarization layer 161 allows the diffusion barrier layer 150 to have a flat surface. The planarization layer 161 has no limitation in material but is preferably composed of a conductive metal.

Also, the metal bonding layer 160 may be formed directly on the diffusion barrier layer 150. In other words, when the upper surface of the diffusion barrier layer 150 is formed to be flat and extensive, the metal bonding layer 160 may come into direct contact with the diffusion barrier layer 150.

Referring to FIG. 13, an ultraviolet (UV) absorption layer 230 is introduced onto the metal bonding layer 160, and a temporary substrate body 210 is introduced on the UV absorption layer 230. For example, the temporary substrate body 210 and the UV absorption layer 230 may constitute a temporary substrate 200, and the temporary substrate 200 may be bonded to the structure of FIG. 12.

The temporary substrate body 210 may be a transparent substrate of a flexible material or a rigid material for preventing bowing. When the temporary substrate body 210 is made of a flexible material, a rigid substrate may be additionally provided on a backside of the flexible temporary substrate body 210.

Also, the temporary substrate body 210 is made of any one of glass, sapphire, plastic, and a polymer material, such as PMMA, PUA, polyethylene terephthalate (PET), polyimide (PI), PDMS, polyolefin (PO), polyvinyl chloride (PVC), polycarbonate (PC), polyethylene (PE), polypropylene (PP), and PS, but is not limited thereto. Any material through which light of a predetermined wavelength range (e.g., light of a UV wavelength range) can pass is acceptable.

The UV absorption layer 230 includes a material whose physical adhesive strength weakens in response to light of the UV wavelength range or laser light. Preferably, the UV absorption layer 230 may be deposited with at least one of Si including a photoreactant, an acrylic adhesive material, ITO, $InO_2$, $SnO_2$, $SiO_2$, SiNx, $Al_2O_3$, $TiO_2$, and $Ti_2O_5$, and may be made of an alloy or multiple layers thereof.

For example, when UV rays of a range of 190 nm to 280 nm are absorbed by the UV absorption layer 230, intensity of the adhesion weakens, and thus adhesive strength with the metal bonding layer 160 weakens.

Also, to weaken the physical adhesive strength between the metal bonding layer 160 and the temporary substrate 200 in response to light of the UV wavelength range or laser light, an additional bonding layer (not shown) may be introduced on the UV absorption layer 230 of the temporary substrate 200. The additional bonding layer may be formed between the temporary substrate body 210 and the UV absorption layer 230 and may be formed on a surface of the UV absorption layer 230.

The additional bonding layer has a different material as a transparent material through which UV rays can pass than that of the UV absorption layer, and any material can be selected as long as the material has a different thermal expansion coefficient than that of the UV absorption layer.

Also, to improve the adhesive strength between the metal bonding layer 160 and the temporary substrate 200, an additional metal bonding layer 240 may be further formed on the metal bonding layer 160. The additional metal bonding layer 240 may be provided to constitute the temporary substrate 200.

The temporary substrate 200 and the structure of FIG. 12 including the metal bonding layer 160 are bonded together. In other words, the temporary substrate 200 and the structure of FIG. 12 including the metal bonding layer 160 are bonded at a temperature of 200° C. or above and a predetermined pressure, and are preferably bonded by eutectic bonding.

Subsequently, the growth substrate 110 is removed, and the removal of the growth substrate 110 may be implemented by separating the growth substrate 110 from the first semiconductor layer 121. Therefore, when the growth substrate 110 is a sapphire substrate, laser lift off (LLO) is used to remove the growth substrate 110, and when the growth substrate 110 is a silicon substrate, dry etching is used therefor.

Referring to FIG. 14, a chip separation process is performed through an etching process for the structure from which the growth substrate has been separated. Dry or wet etching is used for the chip separation, and an etching region 180 is formed. Therefore, the epitaxial structure 120, the diffusion barrier layer 150, and the metal bonding layer 160 are etched. Consequently, the surface of the UV absorption layer 230 may be exposed through the etching.

According to an embodiment, the UV absorption layer 230 of the etching region 180 is also etched through the chip separation, and a part of a surface of the temporary substrate body 210 may be exposed thereby.

After the growth substrate 110 is separated, first electrodes 140 are formed on an exposed surface of the first semiconductor layer 121. The first electrodes 140 may be made of one or more materials selected from the group consisting of ITO, $InO_2$, $SnO_2$, Ni, Au, Pd, Ag, Pt, Ti, Al, and Cr, or an alloy or multiple layers thereof.

The formation of the first electrodes 140 and the chip separation process may be performed in any sequence. For example, the first electrodes 140 may be formed after the chip separation process, and vice versa.

In the etching process for chip separation, dry or wet etching is used until the UV absorption layer 230 is exposed. When the wet etching is used, etchants and processing times are as shown in Table 1 below.

TABLE 1

| No | Etchant | Mixture | Time | Etching |
|---|---|---|---|---|
| 1 | $O_2$ + HF + $H_2O_2$ | 20:1:1 | 180 sec | Ti |
| 2 | $HNO_3$ + HCl | 1:3 | 180 sec | Au |
| 3 | HF + HCl | 1:1 | 60 sec | Sn |
| 4 | $HNO_3$ + HCl | 1:3 | 120 sec | Au |
| 5 | HF + HCl | 1:1 | 60 sec | Sn |
| 6 | $HNO_3$ + HCl | 1:3 | 120 sec | Au |
| 7 | HF + HCl | 1:1 | 60 sec | Sn |
| 8 | $H_2SO_4$ + $H_2O_2$ | 1:2 | 10 min | Ti, Ni, Cu, Ag |
| 9 | BOE6:1 | X | 5 min | $SiO_2$ |

Also, a method such as laser scribing, diamond tip scribing, or the like may be used in the chip separation process.

Preferably, a size of separated LED structures 100 is 1 μm to 300 μm. However, the size is not limited thereto, and may be changed as necessary.

When the additional bonding layer is disposed on or under the UV absorption layer 230, the additional bonding layer may be exposed by the chip separation or may be removed.

Referring to FIG. 15, a light-emitting unit 400 is disposed on a backside of the temporary substrate 200, and UV rays are emitted through the temporary substrate 200. Physical adhesive strength of the UV absorption layer 230 is sharply reduced by the emission of UV rays. In this way, LED structures 100 in a region through which the UV rays are emitted are separated from the temporary substrate 200. Before the UV rays are emitted, the LED structures 100 are bonded to the transfer assembly 10, and after the UV rays are emitted, the LED structures 100 separated from the temporary substrate 200 are moved to the transfer assembly 10.

When the UV rays are emitted through the UV absorption layer 230, the UV absorption layer 230 absorbs energy of the UV rays and undergoes thermal expansion. Also, since the UV absorption layer 230 is bonded to the additional bonding layer composed of metal oxide layers of different materials and the like, the temporary substrate body 210, or the additional metal bonding layer 240, bonding of the UV absorption layer 230 and an adjacent film is sharply weakened due to the thermal expansion. Particularly, when intensity of the UV rays is high, the bonding strength remarkably weakens due to a difference in thermal expansion between the UV absorption layer 230 and the adjacent thin film, and thus the UV absorption layer 230 and the LED structures 100 may be selectively separated.

The ciliary units 12 formed on the body unit 11 of the transfer assembly 10 may be formed according to an array pattern of the LED structures 100, which are transfer targets, or may be formed according to a predetermined pattern to only selectively transfer arbitrary LED structures 100. The ciliary units 12 have elasticity. Therefore, when the ciliary units 12 come into contact with elements including the electrodes 140 formed on the LED structures 100 and the like, the ciliary units 12 are bent or contracted such that adhesive strength may be uniformly maintained without damaging the LED structures 100.

When the transfer assembly 10 and the LED structures 100 come into contact with each other, adhesive strength is produced between the ciliary units 12 and surfaces of the LED structures 100 due to molecular attractive force (van der Waals force), and the transfer assembly 10 and the LED structures 100 are bonded.

Referring to FIG. 16, the LED structures 100 individually separated before the transfer process shown in FIG. 15 undergo a screening process for detecting a faulty LED structure 100' through a test process for determining whether the fabricated LED structures 100 operate normally, and selective transfer is performed so that quality LED structures 100 other than the faulty LED structure 100' detected through the screening process may be transferred or so that only the faulty LED structure 100' may be transferred.

When the transfer assembly 10 and the LED structures 100 are completely bonded, the light-emitting unit 400 is moved so that the faulty LED structure 100' or the normally operating LED structures 100 may be moved to the transfer assembly 10. The light-emitting unit 400 selectively emits light of a predetermined wavelength range toward the temporary substrate 200 bonded to the upper surfaces of the LED structures 100 and reduces adhesive strength between the UV absorption layer 230 and the additional metal bonding layer 240 formed on the temporary substrate 200 such that the faulty LED structure 100' or the LED structures 100 may be transferred.

A constitution of a light-emitting unit is shown in FIG. 17.

The light-emitting unit 400 emits light or laser light of a predetermined wavelength range, and includes a light source unit 410 which outputs the light or laser light of the predetermined wavelength range, a light-source moving unit 420 which operates the light source unit 410 to be moved to an arbitrary position, a light-emission control unit 430 which outputs operation signals for controlling an on/off operation, light output, and light size of the light source unit 410 and controls the light source unit 410 to be moved according to position (or coordinate) information of the faulty LED structure 100', an optical system 440 which changes a size (or an emission range) of light emitted from the light source unit 410, and an optical-system moving unit 450 which moves the optical system 440 so that a focal length of the optical system 440 may be changed.

The light source unit 410 emits UV light of a range of 190 nm to 280 nm, and is composed of a UV wavelength laser or a UV LED. Preferably, a laser which has a UV wavelength and whose laser beam can be adjusted in size is used.

When adhesive strength between the LED structures 100 and the temporary substrate 200 weakens due to UV rays selectively output from the light-emitting unit 400, the transfer assembly 10 is moved away so that the bonded LED structures 100 may be separated from the temporary substrate 200. Then, the LED structures 100 which have been separated individually or in units of arrays excluding the faulty LED structure 100' are moved to the transfer assembly 10.

Also, when the LED structures 100 are moved individually or in units of arrays, UV rays or UV laser light may be emitted according to a predetermined pattern not to be emitted toward a partial region of the temporary substrate 200. Then, the temporary substrate 200 which does not react to the UV rays maintains adhesive strength, and only an array pattern of the LED structures 100 or arbitrary LED structures 100 that are transfer targets toward which the UR rays have been emitted are moved to the transfer assembly 10.

Referring to FIG. 18, when the adhesive strength between the LED structures 100 and the temporary substrate 200 weakens due to the UV rays selectively output from the light-emitting unit 400, the transfer assembly 10 is moved away so that the bonded LED structures 100 may be separated from the temporary substrate 200. Then, the LED structures 100 which have been separated individually or in units of arrays excluding the faulty LED structure 100' are moved to the transfer assembly 10.

Referring to FIGS. 19 and 20, when the selective movement of the LED structures 100 to the transfer assembly 10 is completed, the LED structures 100 are moved to a target substrate 300, and then the LED structures 100 and the target substrate 300 are bonded.

When the LED structures 100 and the target substrate 300 are bonded, one edge of the transfer assembly 10 is bent so that adhesive strength between the transfer assembly 10 and the LED structures 100 may be removed.

In other words, the adhesive strength is produced by uniform contact between the ciliary units 12 and the surfaces of the LED structures 100, but the transfer assembly 10 is bent such that the uniform contact between the ciliary units 12 and the LED structures 100 is not maintained.

When air is introduced into gaps which are made between the ciliary units 12 and the surfaces of the LED structures 100 due to the bending, van der Waals attractive force and capillary attractive force are removed. Therefore, the adhesive strength between the transfer assembly 10 and the LED structures 100 is removed, and the LED structures 100 are transferred onto the target substrate 300.

As the target substrate 300, target-substrate bonding units 320 in an arbitrary pattern are formed on a target substrate body 310. At least one of a general soldering material, Sn, In, Ni, Au, Pd, Cu, Ag, Ge, Al, AuSn, PdIn, AgIn, and a paste containing Cu and Ag or Ag may be used in the target-substrate bonding units 320, and the LED structures 100 may be permanently bonded to the target-substrate bonding units 320.

Referring to FIGS. 21 and 22, before the LED structures 100 are moved, the target-substrate bonding units 320 may be formed on the target substrate 300, and then post units 330 may be formed.

After the LED structures 100 are moved to the target substrate 300, the post units 330 fix the LED structures 100 at predetermined positions on the target substrate 300 and electrically insulate upper electrodes (e.g., the first electrodes 140) formed on the LED structures 100 from the target-substrate bonding units 320.

The post unit 330 may be made of various materials, such as epoxy, acryl, PMMA, benzocyclobutene (BCB), PI, PU, polyester (PE), a photoresist (PR), and the like, but is not limited thereto.

The LED structures 100 transferred to the target substrate 300 are permanently bonded at a temperature of 350° C. or below and may form an array through a coupling electrode 500.

Meanwhile, at least one of the LED structures 100 and the target substrate 300 may be heated to transfer the LED structures 100 to the target substrate 300 and bond the LED structures 100 and the target substrate 300.

Alternatively, the bonding process may be performed by using a predetermined pressure.

Second Embodiment

FIGS. 24 to 35 are cross-sectional views showing a process of transferring LED structures according to the second embodiment of the present invention.

Referring to FIG. 24, a p-n junction epitaxial structure 120 in which a first semiconductor layer, an active layer, and a second semiconductor layer are sequentially installed is grown on a growth substrate 110. Second electrodes 130 are formed on an upper surface of the second semiconductor layers, and first electrodes 140 are formed on an exposed part of the first semiconductor layer.

Referring to FIG. 25, the epitaxial structure 120, the first electrodes 140, and the second electrodes 130 are formed. The epitaxial structure 120 is formed according to a crystalline structure of the growth substrate 110 in a crystal growth method, and is composed of the first semiconductor layer, the active layer, and the second semiconductor layer as mentioned above. The first electrodes 140 and the second electrodes 130 are formed on the first semiconductor layer and the second semiconductor layer, respectively. Also, a protective layer 150' is formed to electrically insulate the electrodes from each other.

Referring to FIGS. 26 and 27, a metal bonding layer 160 is formed on each of the first electrodes 140 and the second electrodes 130 for bonding to a support substrate 200. The support substrate 200 is bonded to the metal bonding layers 160. The support substrate 200 is composed of a support substrate body 210 and a UV absorption layer 230. The support substrate body 210 and the UV absorption layer 230 have the same materials as described above in the first embodiment. Also, additional bonding layers 240 may be formed between the support substrate body 210 and the UV absorption layer 230. Materials of the UV absorption layer 230 and the additional bonding layers 240 and a positional relationship therebetween are the same as described above in the first embodiment.

An LED structure 100a and the support substrate 200 are bonded at room temperature or at 200° C. or above. Preferably, the LED structure 100a is bonded to the support substrate 200 by eutectic bonding, and may be pressurized at a predetermined pressure so that adhesive strength between the LED structure 100a and the support substrate 200 may increase.

Referring to FIGS. 28 and 29, when the LED structure 100a is bonded to the additional metal bonding layer 240 of the support substrate 200 through the metal bonding layers 160, the growth substrate 110 is removed from the LED structure 100a.

When the growth substrate 110 is removed, the epitaxial structure 120 is divided into individual epitaxial structures 120 through an etching process. At this time, an etching region 180 for chip separation is formed on the epitaxial structure 120 through a dry or wet etching process, and thereby the epitaxial structure 120 is divided into the individual units. The etching region 180 allows etching up to the UV absorption layer 230 of the support substrate 200.

According to an embodiment, a surface of the UV absorption layer 230 in the etching region 180 may be exposed.

Referring to FIGS. 30 and 31, a faulty LED structure is selected from the LED structure 100a divided into individual units through a screening process. A transfer assembly 10 is bonded under the LED structure 100a so that the LED structure 100a may be transferred from the support substrate 200 onto the transfer assembly 10, and a light-emitting unit 400 is moved so that light may be selectively emitted toward the LED structure 100a.

At this time, the light-emitting unit 400 selectively emits light toward only quality LED structures other than a faulty LED structure detected through the screening process.

When adhesive strength weakens in a selective region of the support substrate 200 due to the light output from the light-emitting unit 400, the LED structure 100a at the position where the adhesive strength is weakened is separated from the support substrate 200, and thus is selectively transferred onto the transfer assembly 10.

Referring to FIG. 32, after the LED structure 100a is moved to a target substrate 300a, the metal bonding layers 160 and the additional metal bonding layers 240 are fixed at predetermined positions on the target substrate 300a through the post unit 330, and electrically connected to target-substrate bonding units 320 and 320a of the target substrate 300a. LED structures 100b transferred to the target substrate 300a are permanently bonded at a temperature of 350° C. or below.

Therefore, it is possible to provide LED structures which can be easily transferred onto another substrate and a transfer assembly whose adhesive strength with LED structures in spite of repetitive transfer processes, and it is possible to selectively provide only quality LED structures through a screening process for selectively removing a faulty LED structure.

Referring to FIG. 33, a new temporary substrate 200a instead of the target substrate shown in FIG. 32 is introduced to the structure of FIG. 31.

The temporary substrate 200a is composed of an adhesive layer 250 and a temporary substrate body 210. The adhesive layer 250 may be the UV absorption layer of the first embodiment or a polymer resin.

The LED structures 100b individualized and bonded to the transfer assembly 10 in FIG. 31 are bonded to the temporary substrate 200a.

Referring to FIG. 34, when the LED structures 100b are completely transferred onto the temporary substrate 200a, a process of transferring the LED structures 100b onto a target substrate 300b is performed.

A bonding layer 340 for permanently bonding the LED structures 100b is formed on the target substrate 300b. The bonding layer 340 can be a conductive paste or a non-conductive epoxy, and is preferably made of a non-conductive epoxy or a paste.

Light or laser light of a predetermined wavelength range emitted from the light-emitting unit 400 to transfer the LED structures 100b onto the target substrate 300b weakens adhesive strength of the adhesive layer 250 of the temporary substrate 200a, thereby facilitating the transfer of the LED structures 100b.

Also, when the bonding layer 340 formed on the target substrate body 310 is hardened by using UV rays or heat, the LED structures 100b have high bonding strength with the target substrate such that the LED structures 100b may be separated from the temporary substrate 200a.

Referring to FIG. 35, when the transfer onto the target substrate 300b is completed, n-type and p-type electrodes may be formed in series or parallel for an array of the LED structures 100b by using a screen printing process or an additional patterning process such that an LED structure array may be formed.

Third Embodiment

FIGS. 36 to 40 are cross-sectional views showing a process of transferring LED structures according to the third embodiment of the present invention.

Referring to FIG. 36, an epitaxial structure 120 is formed on a growth substrate 110, and electrodes are formed on each of semiconductor layers of the epitaxial structure 120. The epitaxial structure 120 has a first semiconductor layer, an active layer, and a second semiconductor layer, and materials and the like thereof are the same as described above in the first embodiment.

First electrodes 140 are formed on the first semiconductor layer, and second electrodes 130 are formed on the second semiconductor layer. As described above, the first semiconductor layer is exposed by mesa-etching the second semiconductor layer and the active layer which have been epitaxially grown, and the first electrodes 140 are formed on a part of the exposed first semiconductor layer. Therefore, the epitaxial structure 120 shown in FIG. 36 has a predetermined step.

Referring to FIG. 37, a chip separation process in which the epitaxial structure 120 is etched is shown. A part of the growth substrate 110 in a lower portion is exposed by the chip separation process. In the individualized epitaxial structures 120, protective layers 150' are formed in gaps between the first electrodes 140 and the second electrodes 130 to electrically insulate the first electrodes 140 and the second electrodes 130 from each other. The protective layers 150' are formed to expose partial surfaces of the first electrodes 140 and the second electrodes 130 and cover the epitaxial structures 120. In this way, it is possible to obtain LED structures 100c composed of the individualized epitaxial structures 120, the first electrodes 140, the second electrodes 130, and the protective layers 150'.

Referring to FIG. 38, the transfer assembly 10 disclosed in fabrication examples 1 and 2 of the transfer assembly is introduced to the structure shown in FIG. 37. In other words, the transfer assembly 10 has ciliary shapes and is a polymer material, and thus can be easily bonded to the individualized LED structures 100c.

Referring to FIG. 39, LLO is performed by emitting laser light through a backside of the growth substrate 110, and the individualized LED structures 100c are selectively bonded to the transfer assembly 10. The LED structures 100c may have a predetermined step in surfaces thereof due to the mesa-etching, the electrode-forming process, and the like. However, the formed step is less than 1 μm in height, and the transfer assembly 10 having the polymer material may have capillary attractive force along the formed step. When the transfer assembly 10 has a hardened material rather than an elastic material, capillary attractive force cannot be exerted thereon. However, the transfer assembly 10 of the present embodiment has the polymer material which is flexible, and thus has an excellent surface adsorption capability along the steps of the LED structures 100c. Therefore, the LED structures 100c separated from the growth substrate 110 are easily bonded to the transfer assembly 10.

Referring to FIG. 40, the LED structures 100c moved to the transfer assembly 10 are transferred onto a target substrate 300c. A bonding layer 340 for permanently bonding the LED structures 100c is formed on the target substrate 300c. The bonding layer 340 can be a conductive paste or a non-conductive epoxy, and is preferably made of a non-conductive epoxy or a paste.

When the LED structures 100c are bonded to the target substrate 300c, one edge of the transfer assembly 10 is bent so that adhesive strength between the transfer assembly 10 and the LED structures 100c may be removed.

In other words, the adhesive strength is produced by uniform contact between the ciliary units 12 and the surfaces of the LED structures 100c, but the transfer assembly 10 is bent such that the uniform contact between the ciliary units 12 and the LED structures 100c is not maintained.

When air is introduced into gaps which are made between the ciliary units 12 and the surfaces of the LED structures 100c due to the bending, van der Waals attractive force and capillary attractive force are removed. Therefore, the adhesive strength between the transfer assembly 10 and the LED structures 100c is removed, and the LED structures 100c are transferred onto the target substrate 300c.

The present invention has been described above with reference to exemplary embodiments, but those of ordinary skill in the art to which the present invention pertains should appreciate that various changes and modifications can be made without departing from the spirit and scope of the present invention as set forth in the following claims.

Herein, thicknesses of lines or sizes of components in the drawings may have been exaggerated for the sake of convenience and clarity in description. The terms used above are defined in consideration of functionality in the present invention and may vary according to an intention of a user or operator or a usual practice. Therefore, definitions thereof should be made on the basis of the overall content of this specification.

The invention claimed is:

1. A method of transferring light-emitting diode (LED) structures, the method comprising:
   forming an epitaxial structure on a growth substrate;
   bonding the epitaxial structure to a temporary substrate;
   separating the growth substrate from the epitaxial structure bonded to the temporary substrate;
   forming LED structures by individualizing the epitaxial structure separated from the growth substrate;
   transferring the LED structures onto a transfer assembly by emitting ultraviolet (UV) rays toward the temporary substrate; and
   moving the LED structures transferred onto the transfer assembly to a target substrate.

2. The method of claim 1, further comprising, after the forming of the epitaxial structure:
   forming a diffusion barrier layer on the epitaxial structure; and
   forming a metal bonding layer on the diffusion barrier layer.

3. The method of claim 2, further comprising, after the forming of the metal bonding layer:
   forming a UV absorption layer,
   wherein the UV absorption layer is made of a material whose physical adhesive strength is weakened in response to light of a UV wavelength range or laser light.

4. The method of claim 1, wherein the temporary substrate comprises:
   a temporary substrate body; and
   a UV absorption layer formed on the temporary substrate body.

5. The method of claim 4, wherein the temporary substrate body is made of glass, sapphire, plastic, or a polymer material as a material for passing UV rays.

6. The method of claim 4, wherein the UV absorption layer includes a material whose physical adhesive strength is weakened in response to light of a UV wavelength range or laser light.

7. The method of claim 6, wherein the UV absorption layer includes Si including a photoreactant, an acrylic adhesive material, indium tin oxide (ITO), InO2, SnO2, SiO2, SiNx, Al2O3, TiO2, or Ti2O5.

8. The method of claim 6, wherein the UV rays are absorbed by the UV absorption layer, and the LED structures are separated from the temporary substrate.

9. The method of claim 4, further comprising:
   a metal oxide layer between the temporary substrate body and the UV absorption layer,
   wherein the metal oxide layer has a different material and a different thermal expansion coefficient than the UV absorption layer.

10. The method of claim 4, wherein an additional metal bonding layer is formed on the UV absorption layer.

11. The method of claim 1, wherein the transfer assembly comprises:
    a body unit configured to have a polymer resin; and
    ciliary units configured to be formed on the body unit and extend from an upper surface of the body unit to be selectively bonded to the LED structures.

12. The method of claim 1, further comprising, after the forming of the LED structures:
    determining whether the LED structures operate normally.

13. A method of transferring light-emitting diode (LED) structures, the method comprising:
    bonding an epitaxial structure formed on a growth substrate to a temporary substrate;
    separating the growth substrate from the epitaxial structure;
    forming individualized LED structures by etching the epitaxial structure;
    determining whether the individualized LED structures operate normally; and
    separating selectively the individualized LED structures determined whether operating normally or not from the temporary substrate and moving the separated LED structures to a transfer assembly by using adhesive strength of van der Waals force or capillary attractive force;
    wherein the temporary substrate comprises:
       a temporary substrate body though which ultraviolet (UV) rays pass; and
       an UV absorption layer formed on the temporary substrate body and whose adhesive strength is lowered when the UV rays are absorbed,
       wherein the separating of the individualized LED structures from the temporary substrate comprises absorbing, by the UV absorption layer, the UV rays so that the adhesive strength of the UV absorption layer is lowered and the LED structures are separated from the UV absorption layer.

14. The method of claim 13, wherein the bonding of the epitaxial structure to the temporary substrate comprises:
    forming a metal bonding layer on the epitaxial structure; and
    bonding the temporary substrate to the metal bonding layer.

15. The method of claim 13, wherein the UV absorption layer includes Si including a photoreactant, an acrylic adhesive material, Ni, Au, Pd, Ag, Pt, Ti, Al, Cr, Cu, indium tin oxide (ITO), InO2, SnO2, SiO2, SiNx, Al2O3, TiO2, or Ti2O5.

16. The method of claim 13, wherein the transfer assembly comprises:
   a body unit;
   ciliary unit bodies configured to be formed to extend from an upper surface of the body unit; and
   adsorption units configured to be installed at ends of the ciliary unit bodies and come into contact with surfaces of the LED structures, and
   the body unit, the ciliary unit bodies, and the adsorption units are formed of an identical polymer resin material.

17. The method of claim 16, wherein the transfer assembly has concave shapes in upper surface regions of the adsorption units and further comprises adsorption unit recesses for increasing contact areas between the adsorption units and the LED structures.

18. A method of transferring light-emitting diode (LED) structures, the method comprising:
   forming an epitaxial structure on a growth substrate;
   bonding the epitaxial structure to a temporary substrate having an ultraviolet (UV) absorption layer;
   separating the growth substrate from the epitaxial structure bonded to the temporary substrate;
   forming LED structures by individualizing the epitaxial structure separated from the growth substrate;
   emitting UV rays toward the temporary structure to lower adhesive strength of the UV absorption layer and bond the LED structures to a transfer assembly;
   disposing the LED structures bonded to the transfer assembly on a target substrate; and
   removing adhesive strength between the LED structures disposed on the target substrate and the transfer assembly by bending one edge of the transfer assembly.

19. A method of transferring light-emitting diode (LED) structures, the method comprising:
   forming an epitaxial structure on a growth substrate;
   forming LED structures separated from each other on the growth substrate by individualizing the epitaxial structure;
   separating the LED structures from the growth substrate and bonding the separated LED structures to a transfer assembly in which ciliary units are formed; and
   separating the LED structures bonded to the transfer assembly from the transfer assembly and transferring the LED structures onto a target substrate.

20. The method of claim 19, wherein each of the LED structures comprises:
   the epitaxial structure configured to have a first semiconductor layer, an active layer, and a second semiconductor layer formed on the growth substrate;
   first electrodes configured to be formed on the first semiconductor layer;
   second electrodes configured to be formed on the second semiconductor layer; and
   a protective layer configured to cover the epitaxial structure and expose parts of the first electrodes and the second electrodes.

21. The method of claim 19, wherein the transfer assembly comprises:
   a body unit; and
   a plurality of ciliary units configured to extend from an upper surface of the body unit by a predetermined length, form a predetermined pattern to be selectively bonded to the LED structures, and provide adhesive strength by having molecular attractive force with surfaces of the LED structures.

* * * * *